(12) United States Patent
Sternchuss et al.

(10) Patent No.: US 9,950,951 B2
(45) Date of Patent: Apr. 24, 2018

(54) SUBSTRATE COATED WITH A LOW-E MULTILAYER

(71) Applicant: SAINT-GOBAIN GLASS FRANCE, Courbevoie (FR)

(72) Inventors: Juliette Sternchuss, Saint Germain en Laye (FR); Jan Hagen, Bonn (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 221 days.

(21) Appl. No.: 14/770,269

(22) PCT Filed: Feb. 25, 2014

(86) PCT No.: PCT/FR2014/050392
§ 371 (c)(1),
(2) Date: Aug. 25, 2015

(87) PCT Pub. No.: WO2014/131980
PCT Pub. Date: Sep. 4, 2014

(65) Prior Publication Data
US 2016/0002098 A1    Jan. 7, 2016

(30) Foreign Application Priority Data
Feb. 27, 2013    (FR) ..................... 13 51729

(51) Int. Cl.
*B32B 7/02*    (2006.01)
*C03C 17/34*    (2006.01)
(Continued)

(52) U.S. Cl.
CPC ...... *C03C 17/3417* (2013.01); *B32B 17/1077* (2013.01); *B32B 17/10201* (2013.01);
(Continued)

(58) Field of Classification Search
CPC ........ B32B 17/10201; B32B 17/10761; B32B 17/1077; C03B 23/0235; C03B 25/025;
(Continued)

(56) References Cited

U.S. PATENT DOCUMENTS 4,504,109 A * 3/1985 Taga ..................... G02B 5/282
359/359
6,797,388 B1 * 9/2004 Szanyi ............... C03C 17/3417
427/164

(Continued)

FOREIGN PATENT DOCUMENTS

FR    2 963 343 A1    2/2012
JP    H11-149063 A    6/1999
(Continued)

OTHER PUBLICATIONS

International Search Report as issued in International Patent Application No. PCT/FR2014/050392, dated Apr. 29, 2014.

Primary Examiner — Maria V Ewald
Assistant Examiner — Travis M Figg
(74) Attorney, Agent, or Firm — Pillsbury Winthrop Shaw Pittman LLP

(57) ABSTRACT

A material includes a substrate with a thin-film multilayer coated on at least one surface of the substrate, the thin-film multilayer including at least two films based on a transparent electrically conductive oxide. The at least two films are separated by at least one dielectric intermediate film having a physical thickness of at most 50 nm. No metal films is deposited between the at least two films based on a transparent electrically conductive oxide. The thin-film multilayer further includes at least one oxygen barrier film located above the film located furthest from the substrate of the at least two films based on a transparent electrically conductive oxide. Each film of the at least two films based on a (Continued)

Figure 1:
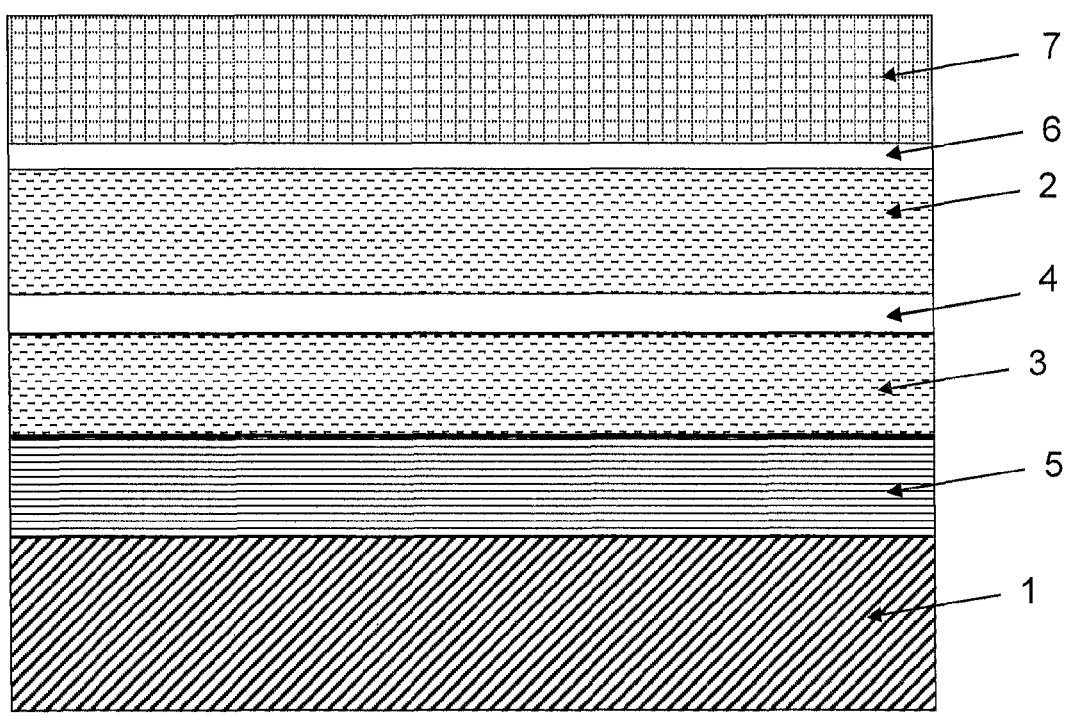

transparent electrically conductive oxide has a physical thickness in a range of from 20 to 80 nm.

21 Claims, 2 Drawing Sheets

(51) Int. Cl.
*B32B 17/10* (2006.01)
*C03B 23/023* (2006.01)
*C03B 25/02* (2006.01)
*C03B 27/012* (2006.01)
*C23C 14/35* (2006.01)
*C23C 14/58* (2006.01)

(52) U.S. Cl.
CPC .... *B32B 17/10761* (2013.01); *C03B 23/0235* (2013.01); *C03B 25/025* (2013.01); *C03B 27/012* (2013.01); *C03C 17/3435* (2013.01); *C23C 14/35* (2013.01); *C23C 14/5806* (2013.01); *C23C 14/5813* (2013.01); *C03C 2217/94* (2013.01); *C03C 2217/948* (2013.01); *C03C 2218/156* (2013.01); *C03C 2218/32* (2013.01)

(58) Field of Classification Search
CPC .............. C03B 27/012; C03C 17/3417; C03C 17/3435; C03C 2217/94; C03C 2217/948; C03C 2218/156; C03C 2218/32; C23C 14/35; C23C 14/5806; C23C 14/5813
See application file for complete search history.

(56) References Cited

U.S. PATENT DOCUMENTS

| | | | |
|---|---|---|---|
| 7,935,423 B2* | 5/2011 | Belliot | C03C 17/3435 428/213 |
| 2009/0044464 A1* | 2/2009 | Schmidt | B32B 17/10036 52/171.2 |
| 2009/0162623 A1* | 6/2009 | Foresti | B29C 59/046 428/210 |
| 2009/0186213 A1* | 7/2009 | Ihlo | C03C 17/36 428/336 |
| 2010/0062245 A1* | 3/2010 | Martin | B32B 17/10174 428/336 |
| 2010/0072884 A1* | 3/2010 | Tchakarov | B32B 17/10036 313/504 |
| 2011/0146172 A1* | 6/2011 | Mauvernay | C03C 17/3435 52/235 |
| 2011/0210656 A1* | 9/2011 | Lemmer | E06B 3/6715 312/405 |
| 2012/0048722 A1 | 3/2012 | McLean et al. | |
| 2012/0087005 A1* | 4/2012 | Reymond | C03C 17/36 359/360 |
| 2012/0164420 A1* | 6/2012 | Lemmer | C03C 17/3681 428/216 |
| 2012/0177900 A1* | 7/2012 | Laurent | B32B 17/10036 428/213 |
| 2013/0039059 A1* | 2/2013 | Montgermont | E06B 3/66 362/235 |

FOREIGN PATENT DOCUMENTS

| WO | WO 2011/122152 A1 | 10/2011 |
|---|---|---|
| WO | WO 2012/022876 A2 | 2/2012 |

* cited by examiner

SUBSTRATE COATED WITH A LOW-E MULTILAYER

CROSS REFERENCE TO RELATED APPLICATIONS

This application is the U.S. National Stage of PCT/FR2014/050392, filed Feb. 25, 2014, which in turn claims priority to French Patent Application No. 1351729, filed Feb. 27, 2013. The contents of all of these applications are incorporated herein by reference in their entirety.

The invention relates to the field of materials comprising a substrate coated on at least one of its faces with a thin-film multilayer having low-E properties.

Low-E coatings deposited on substrates, especially substrates made of glass, have reflective properties in the infrared, i.e. they reflect heat, these properties being useful in a wide range of applications.

In the glazing units fitted in ground vehicles, especially automobiles, rail or even aerial or water vehicles, low-E glazing units allow, when the weather is hot, incident solar radiation to be partially reflected, and therefore heating of the passenger compartment of said vehicles to be limited and, where relevant, air conditioning costs to be decreased. In contrast, when the weather is cold, these glazing units allow heat to be retained in the passenger compartment, and therefore the power consumed heating the compartment to be decreased. The same goes for the glazing units fitted in buildings.

Low-E properties are also useful when making glazing units with anti-condensation properties. Specifically, glazing units with very low thermal transmission coefficients are subject to the appearance of water condensation on the exterior surface thereof, in the form of fogging or frosting. If the sky is clear overnight, radiative heat exchange with the sky causes a drop in temperature that is not sufficiently compensated for by heat coming from the interior of the dwelling. When the temperature of the external surface of the glazing unit drops below the dew point, water condenses on said surface, reducing visibility through the glazing unit in the morning, sometimes for a number of hours.

Low-E coatings may also be deposited on the glass substrates used in fire-resistant glazing units or oven doors, or in contrast the doors or bodies of refrigerators or freezers, in order to limit the transfer of heat through the glazing unit or door. In the former case it is a question of increasing human safety by limiting the temperature increase on that side of the glazing unit or door which is opposite the heat source, and in the latter case a question of decreasing power consumption.

In these various applications, it is known to use thin-film multilayers containing a film of a transparent electrically conductive oxide, frequently called a TCO (for transparent conductive oxide). This is because these conductive but nevertheless transparent films have low emissivities, correlated with low resistivities or sheet resistances.

The invention aims to improve this type of multilayer, in particular their flexural strength and/or bending resistance. Other advantages of the invention will become apparent in the rest of the text.

For this purpose, one subject of the invention is a material comprising a substrate coated on at least some of at least one of its faces with a thin-film multilayer comprising at least two films based on a transparent electrically conductive oxide, said films being separated by at least one dielectric intermediate film the physical thickness of which is at most 50 nm and especially 30 or even 20 nm, no metal films being deposited between said films based on a transparent electrically conductive oxide, said multilayer furthermore comprising at least one oxygen barrier film above that film based on a transparent electrically conductive oxide which is furthest from the substrate, each film based on a transparent electrically conductive oxide possessing a physical thickness comprised in a range extending from 20 to 80 nm.

Preferably, the substrate is coated on only one of its faces with such a multilayer.

The expressions "under" and "below", qualifying the relative position of a first film relative to a second film in the multilayer, are understood to mean that the first film is closer to the substrate than the second film. The expressions "above" and "on", qualifying the relative position of a first film relative to a second film in the multilayer, are understood to mean that the first film is further from the substrate than the second film. These expressions do not necessarily mean that the two films make contact, this however not being ruled out and sometimes even being preferred, as will be seen in the rest of the text.

The expression "based on" is especially understood to mean that the film comprises at least 80% or 90% and even 95% by weight of the compound in question. The film may even advantageously consist or essentially consist of such a compound.

The multilayer comprises at least two thin-films based on a transparent electrically conductive oxide (TCO). The number of films based on a TCO is preferably comprised in a range extending from 2 to 5 and especially from 2 to 4. Preferably, this number is 2 or 3 and advantageously 2.

The expression "based on" is especially understood to mean that each film based on a TCO comprises at least 80% or 90% and even 95% by weight of such an oxide. Each film based on a TCO even advantageously consists of such an oxide.

Advantageously, each TCO film of the multilayer is based on or consists of the same TCO, this making it possible to simplify the deposition conditions.

Alternatively, the TCO films may be of different nature. Thus, the multilayer preferably comprises exactly two films of a given TCO.

Preferably, each transparent electrically conductive oxide is chosen from mixed indium tin oxide (ITO), mixed indium zinc oxide (IZO), gallium- or aluminum-doped zinc oxide (AZO), niobium-doped titanium oxide, zinc or cadmium stannate and antimony- and/or fluorine-doped tin oxide.

In the case of aluminum-doped zinc oxide, the dopant content (i.e. the weight of aluminum oxide relative to the total weight) is preferably lower than 3%. In the case of gallium, the dopant content may be higher, typically comprised in a range extending from 5 to 6%. For films based on fluorine-doped tin oxide, the atomic percentage of fluorine is preferably at most 5% and generally from 1 to 2%.

The refractive index of the film based on a TCO, at a wavelength of 550 nm, is preferably comprised in a range extending from 1.7 to 2.5.

According to one preferred embodiment, each film based on a TCO is a film based on ITO, and even an ITO film. According to one particularly preferred embodiment, the multilayer comprises exactly two ITO films. The atomic percentage of Sn is advantageously comprised in a range extending from 5 to 70% and especially from 10 to 60%. ITO has a good climactic durability, an excellent resistance to corrosion, and is also particularly appreciated for its high electrical conductivity, which permits small thicknesses to be used to obtain a given emissivity level, thereby allowing the loss of solar factor to be minimized. Easily deposited by cathode sputtering processes, especially magnetron cathode sputtering processes, these films are characterized by a lower roughness, and therefore by a lower tendency to foul. Specifically, during manufacture, handling and maintenance of a glazing unit, rougher films have a tendency to trap various residues, which are particularly difficult to remove.

Each film based on a transparent electrically conductive oxide possesses a physical thickness comprised in a range extending from 20 to 80 nm and especially from 30 to 80 nm. The cumulative physical thickness of all the films based on a transparent electrically conductive oxide is preferably comprised in a range extending from 40 to 400 nm and especially from 60 to 300 nm. When it is a question of films based on ITO or consisting of ITO, and especially when the multilayer comprises exactly two of these films, the cumulative physical thickness of all the films based on ITO or consisting of ITO is preferably comprised in a range extending from 40 to 200 nm and especially from 60 to 160 nm.

The physical thickness of each TCO film may be identical or different.

It has been observed by the inventors that the emissivity of the multilayer may be directly regulated by the choice of the cumulative physical thickness of all the TCO films. Surprisingly, despite the presence of at least one intermediate film, the emissivity of the multilayer of n (especially two) TCO films is equivalent to that of a multilayer comprising a single film of the same TCO having a thickness equal to the cumulative thickness of the n films. It is therefore for example possible to obtain the same emissivity (or sheet resistance) by replacing a single film of a TCO (especially ITO) having a physical thickness of 100 nm with two films of the same TCO each having a physical thickness of 50 nm, said two films being separated by at least one intermediate film. In contrast, flexural strength and/or bending resistance properties are clearly improved by such a choice, as demonstrated in the rest of the text. Furthermore, this choice enables a certain flexibility in the design and industrial manufacture of the multilayer, each of the TCO films possibly being adjusted independently of one another. For example, the first TCO film closest to the substrate may be deposited so as to be more oxidized and therefore more conductive than the second, the latter in contrast being more durable, since it is less well protected.

The cumulative physical thickness of the TCO films is therefore chosen depending on the emissivity desired for or required by the application. The term "emissivity" is understood to mean the normal emissivity at 283 K as defined in standard EN 12898. The emissivity of the multilayer is preferably at most 0.4 or 0.3, especially 0.25 and even 0.2.

In the case of automotive glazing units (windshields, roofs, side windows, rear windshields), the targeted emissivity is preferably at most 0.25, especially 0.2 and even 0.15 or 0.1.

In the case of anti-condensation glazing units, for a given anti-condensation performance the sought-after emissivity depends on various factors including the inclination of the glazing unit and its thermal transmission coefficient Ug. Typically, an inclined glazing unit and/or a glazing unit with a low thermal transmission coefficient will require a lower emissivity, and therefore a larger cumulative thickness. When the glazing unit is intended to be placed vertically, the emissivity is preferably at most 0.4 or 0.3. The cumulative physical thickness would then generally be at least 60 nm and often at most 120 nm. When the glazing unit is intended to be placed at an inclination, for example in roofing applications, or when the thermal transmission coefficient Ug is lower than or equal to 1 W/(m²·K), or 0.6 W/(m²·K), the emissivity is preferably at most 0.3, or 0.2 and even 0.18. The cumulative physical thickness will preferably be at least 60 nm, or 70 or 100 nm and at most 200 nm.

According to the invention, the multilayer comprises at least two films based on a transparent electrically conductive oxide, said films being separated by at least one dielectric intermediate film.

The presence of metals between the TCO films is ruled out because it decreases the resistance of the multilayer to corrosion and bending or tempering and also the light transmission of the multilayer. Thus, the multilayer in its entirety normally comprises no metal films.

The use of the term "separated" is understood to mean that the intermediate film is placed between two TCO films, the intermediate film not necessarily making contact with one of the TCO films.

The number of intermediate films separating the films based on TCO preferably varies from 1 to 5, especially from 1 to 3 or from 1 to 2. Advantageously, the thin-film multilayer comprises at least two films (especially two films) based on a transparent electrically conductive oxide, said films being separated by at most two intermediate films and especially by a single intermediate film.

Preferably, the films based on TCO are separated pairwise by a single intermediate film, making contact with both the films based on TCO that flank it. When the multilayer comprises exactly two films based on TCO, the multilayer then comprises a sequence of the TCO/intermediate film/ TCO, especially ITO/intermediate film/ITO type.

The or each dielectric intermediate film is preferably based on a compound chosen from oxides, nitrides or oxynitrides of silicon, aluminum, titanium, tin, zinc, zirconium, niobium, nickel, chromium or one of their mixtures. It preferably essentially consists of such a compound or consists of such a compound.

More particularly, the or each dielectric intermediate film preferably essentially consists of a compound chosen from an oxide, nitride or oxynitride of silicon and/or aluminum, a nitride or an oxide of titanium, an oxide of nickel and chromium, a niobium nitride and a zinc tin oxide. Preferably, the or each dielectric intermediate film is based (or essentially consists of) silicon oxide, silicon nitride, titanium oxide or a zinc tin oxide. Silicon oxide or nitride are particularly preferred. Silicon nitride or zinc tin oxide are particularly appreciated because their refractive index is close to that of ITO, to the point that their presence does not affect the optical properties of the multilayer. Preferably, the refractive index, for a wavelength of 550 nm, of the or each intermediate film (especially of the single intermediate film) is at least 1.8, especially 1.9 and advantageously comprised in a range extending from 1.8 to 2.5 and especially from 1.9 to 2.2.

These denominations are not intended to specify the actual stoichiometry of the films and/or preclude the presence of dopants. By way of example, the silicon oxide does not necessarily have the exact formula $SiO_2$ and/or may be doped, for example with aluminum or boron atoms, with the aim of facilitating deposition by cathode sputtering processes. Likewise, the silicon nitride does not necessarily possess a stoichiometry respecting the formula $Si_3N_4$, and/or may be doped, for example with aluminum, zirconium or boron atoms, with the aim of facilitating deposition by cathode sputtering processes. The expression "essentially consists of" includes the possibility of such doping.

The physical thickness of the (or each) dielectric intermediate film is preferably comprised in a range extending from 2 to 30 nm, or from 2 to 20 nm, especially from 5 to 15 nm and even from 8 to 12 nm. The presence of thin intermediate films surprisingly makes it possible to improve the flexural strength and bending resistance of the multilayers, without however affecting their optical appearance.

The various preferred embodiments described above may of course be combined with one another in any possible combination. According to one particularly preferred combination, the multilayer comprises exactly two ITO films flanking a single dielectric intermediate film and making direct contact therewith. The multilayer therefore comprises a sequence of the ITO/intermediate film/ITO type, especially of the ITO/SiN$_x$/ITO or ITO/SiO$_x$/ITO or ITO/SnZnO$_x$/ITO or ITO/TiO$_x$/ITO type, the denominations SiN$_x$, SiO$_x$, SnZnO$_x$ or TiO$_x$ not precluding the presence of dopants, as explained supra.

The multilayer comprises, above that film based on a TCO which is furthest from the substrate, (at least) one oxygen barrier film.

The aim of the oxygen barrier film is to protect the films based on TCO, and especially the ITO films, from oxidation. More particularly, the barrier film, placed on and preferably making contact with that film based on a TCO which is furthest from the substrate, allows the oxidation state of the latter film, and therefore its electrical and optical properties after heat treatments, especially tempering or bending heat treatments, to be very precisely controlled.

The physical thickness of the oxygen barrier film is preferably comprised in a range extending from 5 to 100 nm and especially from 10 to 50 nm.

The barrier film is preferably based on a compound chosen from silicon nitride, niobium oxide, tungsten oxide, bismuth oxide, titanium oxide, zirconium nitride and aluminum nitride. The barrier film preferably essentially consists of silicon nitride, which has turned out to be the most effective. As indicated above, this denomination is not intended to specify the actual stoichiometry of the film and/or preclude the presence of dopants, especially aluminum, boron or zirconium.

The multilayer preferably comprises at least one other film, placed under that film based on a TCO which is closest to the substrate and/or on the oxygen barrier film furthest from the substrate. As indicated above, the terms "on" and "below" do not necessarily mean that the films make contact, merely that they are closer to the substrate ("below") or further away therefrom ("on"). The case where these films effectively make direct contact with the closest to TCO or barrier films is however not excluded, as will be seen below.

Advantageously, the multilayer comprises at least one film (especially one, two or three films) placed below that film based on a TCO which is closest to the substrate, and at least one film (especially one, two or three films) placed on the oxygen barrier film furthest from the substrate.

The multilayer thus advantageously comprises, below that film based on a TCO which is closest to the substrate, (at least) one adhesion film and/or at least one neutralizing film or multilayer.

Placed between the substrate and that film based on a TCO which is closest to the latter, a neutralizing film or multilayer allows the appearance of the material in reflection, and especially its color in reflection, to be influenced. Bluish colors, characterized by negative b* color coordinates, are often preferred. In the case of a single film, its refractive index is preferably comprised between the refractive index of the substrate and the refractive index of the film based on a TCO. By way of nonlimiting example, it is possible to use a film of mixed silicon tin oxide (SiSnO$_x$), of silicon oxycarbide or oxynitride, of aluminum oxide or of mixed titanium silicon oxide. A film multilayer comprising a high-index film and a low-index film, for example a TiO$_x$/SiO$_x$ or SiN$_x$/SiO$_x$ multilayer, is also usable. The physical thickness of this or these films is preferably comprised in a range extending from 5 to 70 nm and especially from 15 to 30 nm. The preferred neutralizing film or multilayer is a neutralizing film made of silicon oxynitride or an SiN$_x$/SiO$_x$ multilayer. Preferably, the neutralizing film or multilayer makes direct contact both with the substrate and with the TCO film closest to the substrate.

Placed between the substrate and that film based on a TCO which is closest to the latter, an adhesion film, which advantageously has a refractive index close to that of the (especially glass) substrate, allows the ability to withstand tempering and bending to be improved by promoting adhesion of the TCO film. The adhesion film is preferably made of silica. Its physical thickness is preferably comprised in a range extending from 20 to 200 nm and especially from 30 to 150 nm. The adhesion film preferably makes direct contact both with the substrate and with the TCO film closest to the latter.

The multilayer advantageously comprises, on the barrier film furthest from the substrate, at least one low-refractive-index film.

Preferably, a low-refractive-index film, typically of an index of at most 1.8, or 1.50 and even 1.48 (for a wavelength of 550 nm), especially based on silica or essentially consisting of silica, is placed above the oxygen barrier film. Its aim is to regulate the optical and/or thermal properties of the coating. In particular, its thickness may be adapted in order to decrease the reflection factor of the multilayer or optimize its solar factor. The physical thickness of the low-index film is preferably comprised in a range extending from 20 to 100 nm, especially from 30 nm to 90 nm or from 40 to 80 nm.

The low-index film may be the last film of the multilayer and therefore the film that makes contact with the atmosphere. Alternatively, at least one other thin film may be deposited above the low-refractive-index film.

It is thus possible to place above, preferably on and making contact with, the film based on silicon oxide, a protective film based on titanium oxide the physical thickness of which is advantageously at most 30 nm and especially 20 nm or 10 nm. This film is advantageously photocatalytic.

Very thin photocatalytic films, although less active photocatalytically speaking, nonetheless have good self-cleaning, anti-smudging and anti-fouling properties. Specifically, even for films of very small thicknesses, the photocatalytic titanium oxide has the particularity, when it is irradiated by sunlight, of becoming extremely hydrophilic, with water contact angles smaller than 5° and even 1°, thereby making it easier for water to form into rivulets and remove dirt deposited on the surface of the film. Furthermore, thicker films have a high light reflection, the effect of this being to decrease solar factor. The protective and especially photocatalytic film is preferably a film made of titanium oxide, the refractive index of which is in particular comprised in a range extending from 2.0 to 2.5. The titanium oxide is preferably at least partially crystallized in the anatase form, which is the most active phase from the point of view of photocatalysis. Mixtures of anatase and rutile phases have also proved to be very active. The titanium dioxide may optionally be doped with a metal ion, for example a transition-metal ion, or with atoms of nitrogen, carbon, fluorine, etc. The titanium dioxide may also be substoichiometric or superstoichiometric. In this embodiment, the entirety of the surface of the (optionally photocatalytic) protective film, which is especially based on titanium oxide, preferably makes contact with the exterior, so as to be able to apply its self-cleaning function to the full. It may however be advantageous to coat the especially titanium dioxide photocatalytic film with a thin hydrophilic film, especially one based on silica, in order to improve the durability of the hydrophilicity over time.

Alternatively, the multilayer may not comprise a photocatalytic film.

The various preferred embodiments described above may of course be combined together. All the possible combinations are not explicitly described in the present text in order not to lengthen it unnecessarily.

In preferred combinations, the multilayer comprises (or consists of) in succession starting from the substrate:
- an adhesion film, for example based on or essentially consisting of silica;
- a first TCO (especially ITO) film;
- a dielectric intermediate film, for example based on or essentially consisting of silica, silicon nitride or zinc tin oxide;
- a second TCO (especially ITO) film;
- an oxygen barrier film, for example based on or essentially consisting of silicon nitride; and
- a low-refractive-index film, for example based on or essentially consisting of silicon.

A neutralizing film or multilayer may replace the adhesion film or be deposited between the adhesion film and the first TCO film. Thus, in another preferred combination, the multilayer comprises (or consists of) in succession starting from the substrate:
- an (optional) adhesion film, for example based on or essentially consisting of silica;
- a neutralizing film or multilayer (especially a high-index film then a low-index film), for example a film essentially consisting of silicon nitride then a film essentially consisting of silica;
- a first TCO (especially ITO) film;
- an especially dielectric intermediate film, for example based on or essentially consisting of silica, silicon nitride or zinc tin oxide;
- a second TCO (especially ITO) film;
- an oxygen barrier film, for example based on or essentially consisting of silicon nitride; and
- a low-refractive-index film, for example based on or essentially consisting of silica.

In these preferred combinations, the successive films make direct contact with the film that precedes them.

A few examples of particularly preferred multilayers are given below:
1. Substrate/$SiO_x$/ITO/$SiN_x$ or $SiO_x$ or $SnZnO_x$/ITO/$SiN_x$/$SiO_x$
2. Substrate/$SiN_x$/$SiO_x$/ITO/$SiN_x$ or $SiO_x$ or $SnZnO_x$/ITO/$SiN_x$/$SiO_x$
3. Substrate/$SiO_x$/$SiN_x$/$SiO_x$/ITO/$SiN_x$ or $SiO_x$ or $SnZnO_x$/ITO/$SiN_x$/$SiO_x$
4. Substrate/$SiO_x$/ITO/$SiN_x$ or $SiO_x$ or $SnZnO_x$/ITO/$SiN_x$/$SiO_x$/$TiO_x$
5. Substrate/$SiN_x$/$SiO_x$/ITO/$SiN_x$ or $SiO_x$ or $SnZnO_x$/ITO/$SiN_x$/$SiO_x$/$TiO_x$
6. Substrate/$SiO_x$/$SiN_x$/$SiO_x$/ITO/$SiN_x$ or $SiO_x$ or $SnZnO_x$/ITO/$SiN_x$/$SiO_x$/$TiO_x$.

In these multilayers, the substrate is preferably made of glass.

Generally, the substrate is preferably made of glass.

According to a first embodiment, the substrate made of glass is transparent and colorless (it is then a question of a clear or extra-clear glass). A clear glass typically contains a content by weight of iron oxide of about 0.05 to 0.2%, whereas an extra-clear glass generally contains about 0.005 to 0.03% iron oxide.

According to a second embodiment, the glass may be colored, for example blue, green, gray or bronze. The glass then contains colorants, principally iron oxide, in contents ranging from 0.5 to 2.0% by weight and optionally cobalt oxide (in contents by weight ranging from 5 to 300 ppm) and/or selenium (in contents by weight ranging from 1 to 10 ppm) or chromium oxide. This embodiment is particularly well adapted to automotive glazing unit applications, but is not preferred in the case where it is sought to maximize solar factor.

The glass is normally mineral glass and preferably soda-lime-silica glass, but it may also be a borosilicate or alumino-borosilicate type glass. The thickness of the substrate is generally comprised in a range extending from 0.5 mm to 19 mm, preferably from 0.7 to 9 mm, especially from 2 to 8 mm or from 4 to 6 mm. The same goes, if relevant, for the other glass sheets of the multiple glazing unit.

The glass substrate is preferably a float glass substrate, i.e. a substrate liable to have been obtained by a process consisting in pouring molten glass onto a molten tin bath (the float bath). In this case, the multilayer may equally well be deposited on the "tin" face as on the "atmosphere" face of the substrate. By "atmosphere" and "tin" faces what is meant is the faces of the substrate having made contact with the atmosphere above the float bath and with the molten tin, respectively. The tin face contains a small amount of superficial tin having diffused into the glass structure.

The glass substrate may be flat or curved and is preferably curved.

The glass substrate may be toughened or thermally tempered in order to improve its mechanical strength properties and impart thereto the shape desired for the application.

As described below, the bending or thermal tempering is useful in order to improve the emissivity properties of the TCO film deposited beforehand. Preferably, the electrical resistivity of the multilayer after the tempering or bending operation is at most $2.2 \times 10^{-4}$ Ω·cm, especially at most $2.1 \times 10^{-4}$ Ω·cm and even $2.0 \times 10^{-4}$ Ω·cm. The emissivity and electrical resistivity properties are closely related.

The substrate may also be made of an organic polymeric material. Polycarbonate, polymethyl methacrylate, polyethylene terephthalate (PET), polyethylene naphthalate (PEN), or even fluoropolymers such as ethylene tetrafluoroethylene (ETFE) are the preferred organic polymeric materials. These substrates are preferably flexible, so that their small thickness allows them to be rolled up. The multilayer according to the invention, because of its higher flexural strength, then has the advantage of not deteriorating when the multilayer is rolled up.

Another subject of the invention is a glazing unit, especially for equipping ground, rail, water or aerial vehicles, especially an automobile windshield, rear windshield or side window or an automobile roof, or for equipping buildings, or a fire-resistant glazing unit, or an oven or refrigerator door, comprising at least one material according to the invention.

This glazing unit is preferably curved. It thus has one or more curvatures, with radii of curvature typically ranging from 10 cm to 40 m. Specifically, the invention makes it possible to obtain materials that are able to undergo complex and high-intensity bending operations without exhibiting defects such as cracks or haze, as demonstrated in the rest of the text.

The glazing unit is for example intended to be fitted in automotive ground vehicles. It may in particular be a question of a windshield, a rear windshield, an automobile roof or of an automobile side window.

This glazing unit may be laminated, especially in the case of a windshield, a roof or, sometimes, side windows, in so far as the material according to the invention is associated with at least one other glass substrate (typically one other substrate, but optionally two or three, for example in the case of armored glazing units or of aerial vehicles) via at least one interlayer sheet made of a polymer such as especially polyvinyl butyral (PVB) or polyurethane (PU). In this case, the material according to the invention is preferably placed so that the multilayer is positioned on face 4, i.e. on the exterior face of the glazing unit, which face is intended to make contact with the passenger compartment of the vehicle. At least one face located inside the laminate (face 2 or 3), or one face of an interlayer sheet, is preferably coated with a multilayer having low-E properties, for example having an emissivity of at most 0.1 or 0.05. It may especially be a question of thin-film multilayers comprising at least one silver film, the or each silver film being placed between a number of dielectric films.

In the case of rear windshields or side windows, the glazing unit is normally not laminated but tempered. In its use position, the multilayer will preferably be placed on face 2, i.e. on the exterior face of the glazing unit, which face is intended to make contact with the passenger compartment of the vehicle.

In this type of application, the substrate is advantageously tinted, especially green, blue or gray. For this purpose, the glass substrate may contain one or more colorants, such as in particular iron oxide, in a content by weight ranging from 0.5 to 2.5%, cobalt oxide, in a content by weight ranging from 0.0010 to 0.03%, chromium oxide, in a content by weight ranging from 0.005 to 0.05%, and selenium, in a content by weight ranging from 0.0001 to 0.005%. In rear-windshield, roof or rear-side-window applications, the light transmission of the glazing unit may for example be comprised between 5 and 70% (and 5 to 20% for a roof). In windshield or front-side-window applications, the light transmission of the glazing unit will preferably be at least 70% or 75%.

The glazing unit may also be intended to be fitted in buildings. It will preferably be a question of a multiple glazing unit, especially a double, triple or higher, glazing unit, a quadruple glazing unit for example. A double glazing unit generally consists of two glass sheets that face each other and house a gas-filled cavity, for example a cavity filled with air, argon, xenon or even krypton. A spacer bar, taking the form of a metal profile, for example made of aluminum, is generally placed on the periphery of the glazing unit between the glass sheets, said bar being securely fastened to the glass sheets with an adhesive, the periphery of the glazing unit being sealed using a mastic, for example a silicone mastic, polysulfide or polyurethane sealant, in order to prevent any ingress of moisture into the gas-filled cavity. In order to limit moisture, a molecular buffer is frequently placed in the spacer bar. A triple glazing unit is formed in the same way, the only difference being that the glass sheets are three in number.

The multiple glazing unit may comprise one or more materials according to the invention, especially a material according to the invention placed so that its multilayer is placed on face 1 of the glazing unit and/or a material according to the invention placed so that its multilayer is placed on face 4 of the glazing unit (for a double glazing unit) or on face 6 (for a triple glazing unit). Placing the multilayer on face 1, i.e. making contact with the exterior of the building, makes it possible to give the glazing unit anti-condensation properties, whereas placing the multilayer on face 4 or 6 (making contact with the interior of the dwelling) provides reinforced thermal insulation functions.

When the glazing unit according to the invention is a triple glazing unit, at least one other face, chosen from faces 2 to 5, is preferably coated with a multilayer having low-E properties. It may especially be a question of thin-film multilayers comprising at least one silver film, the or each silver film being placed between a number of dielectric films. The expression "low emissivity" or, correspondingly, "low-E", is understood to mean an emissivity that is generally at most 0.1 and especially 0.05. Preferably, two other faces, especially faces 2 and 5, are coated with such a multilayer. Other configurations are also possible but less preferred: faces 2 and 3; 2 and 4; 3 and 4; 4 and 5; faces 2, 3 and 4; faces 2, 3 and 5; faces 2, 4 and 5; and faces 2, 3, 4 and 5. When the glazing unit according to the invention is a double glazing unit, face 2 is advantageously coated with a multilayer having low-E properties, especially of the type just described. Alternatively, face 2 may be coated with a solar-control multilayer, this however not being preferable since such a multilayer decreases solar factor.

To improve the acoustic properties or anti-break-in properties of the glazing unit according to the invention, at least one glass sheet of the glazing unit may be laminated to another sheet by means of an interlayer sheet made of a polymer such as polyvinyl butyral (PVB) or polyurethane (PU).

The glazing unit according to the invention may be employed as any type of glazing unit. It may be integrated into a facade, a roof, a veranda. It may be placed vertically or inclined.

For use in a fire-resistant glazing unit or an oven door, the substrate is advantageously made of a heat-resistant glass, for example of a borosilicate or aluminosilicate glass.

Another subject of the invention is a process for obtaining a material according to the invention, in which the films are deposited, especially by cathode sputtering, then undergo a heat treatment chosen from tempering, bending, annealing and rapid annealing treatments.

Preferably, the rapid annealing is carried out using a flame, a plasma torch or laser radiation.

The films of the multilayer are preferably deposited on a flat glass substrate, which generally then takes the form of a large sheet of glass of $3.2 \times 6$ m$^2$, or directly on the glass ribbon during or just after the float processing, the substrate then being cut to the desired size.

The various films of the multilayer may be deposited on the glass substrate using any type of thin-film deposition process. It may for example be a question of a sol-gel process, a (liquid or solid) pyrolysis process, a chemical vapor deposition (CVD) process, especially a plasma-enhanced chemical vapor deposition (PECVD) process and optionally an atmospheric pressure plasma-enhanced chemical vapor deposition process (AP-PECVD), or an evaporation process.

The films of the multilayer are preferably deposited by cathode sputtering, especially magnetron cathode sputtering. This is preferably the case when the TCO film is an ITO film. In this process, a plasma is created under a high vacuum in the vicinity of a target comprising the chemical elements to be deposited. The active species of the plasma bombard the target and tear off said elements, which are deposited on the substrate forming the desired thin film. This process is said to be "reactive" when the film consists of a material resulting from a chemical reaction between the elements torn from the target and the gas contained in the plasma. The main advantage of this process is that it is possible to deposit a very complicated film multilayer on a given line by running the substrate under various targets in succession, this generally taking place in one and the same device.

However, the magnetron process has a drawback when the substrate is not heated during the deposition: the TCO films obtained are poorly crystallized such that their emissivity properties are not optimized. A heat treatment is thus required. Preferably, the heat treatment heats the multilayer and/or substrate to a temperature above 200° C., especially 400° C. and even 600° C. or 700° C.

The heat treatment may be intended to improve the crystallization of the TCO films and therefore the emissivity of the multilayer (the case of tempering, bending, annealing and rapid annealing treatments) and/or provide improved mechanical properties (case of tempering) and/or impart a desired shape (case of bending).

The improvement in the crystallization may be quantified by the increase in the degree of crystallization (i.e. the proportion of crystalline material by weight or by volume) and/or the size of the crystal grains (or the size of coherent diffraction domains measured by X-ray diffraction methods or by Raman spectroscopy). This improvement in crystallization may also be verified indirectly, by measuring the improvement in the properties of the film. In the case of a TCO film, the emissivity decreases, preferably by at least 5 rel % and even at least 10 rel % or 15 rel %, and likewise for its light and energy absorption.

The tempering or annealing treatment is generally carried out in a furnace, a tempering furnace or an annealing furnace, respectively. The entire substrate (coated with the multilayer) is raised to a high temperature, of at least 300° C. in the case of an anneal, and of at least 500° C. and even 600° C. in the case of tempering. In the latter case the substrate is then rapidly cooled in order to create, on the surface of the glass, compressive stresses that will strengthen it mechanically. Depending on the level of the stresses obtained, the terms toughening, semi-tempering or indeed tempering may sometimes be employed, all these treatments being encompassed by the expression "tempering" in the context of the invention.

The bending is generally carried out in a bending furnace. The entire substrate (coated with the multilayer) is raised to a high temperature, of at least 500° C. and especially of a temperature comprised between 500 and 700° C. The bending operation allows one or more curvatures to be created with radii of curvature typically ranging from 10 cm to 40 m. The bending operation may be followed by a step of rapid cooling in order to create, on the surface of the glass, compressive stresses that will strengthen it mechanically; in this case a bending/tempering operation is spoken of.

After the tempering or bending/tempering operation, the surface stresses are advantageously at least 60 MPa or 70 MPa.

The rapid annealing is preferably carried out using a flame, a plasma torch or laser radiation. In this type of process a relative motion is created between the substrate and the device (flame, laser, plasma torch). Generally, the device is movable, and the coated substrate runs past facing the device so that its surface is treated. These processes allow a high energy density to be delivered to the coating to be treated in a very short space of time, thus limiting diffusion of the heat toward the substrate and therefore heating of said substrate. The temperature of the substrate generally reaches at most 100° C. or 50° C. and even 30° C. during the treatment. Each point of the thin film is subjected to the rapid annealing treatment for an amount of time generally smaller than or equal to 1 second and even 0.5 seconds.

The rapid-annealing heat treatment is preferably carried out using laser radiation emitted in the infrared or visible. The wavelength of the radiation is preferably comprised in a range extending from 530 to 1200 nm, or from 600 to 1000 nm and especially from 700 to 1000 nm or from 800 to 1000 nm. Preferably, laser diodes are used, for example emitting at a wavelength of about 808 nm, 880 nm, 915 nm or even 940 nm or 980 nm. Systems of diodes make it possible to obtain very high powers, allowing powers per unit area at the coating to be treated of higher than 20 kW/cm$^2$ and even 30 kW/cm$^2$ to be obtained.

The laser radiation is preferably shaped into at least one laser beam forming a line (called a "laser line" in the rest of the text) that simultaneously irradiates all or some of the width of the substrate. This embodiment is preferred because it avoids the use of expensive displacement systems, which are generally bulky and difficult to maintain. The line-shaped laser beam may especially be obtained using systems of high-power laser diodes combined with focusing optics. The thickness of the line is preferably comprised between 0.01 and 1 mm. The length of the line is typically comprised between 5 mm and 3.2 m. The profile of the line may especially be a Gaussian or tophat profile. The laser line simultaneously irradiating all or some of the width of the substrate may consist of a single line (then irradiating the entire width of the substrate) or of a plurality of optionally separate lines. When a plurality of lines is used, it is preferable for them to be arranged so that all of the area of the multilayer is treated. The or each line is preferably placed at right angles to the run direction of the substrate, or placed obliquely. The various lines may treat the substrate simultaneously, or at different times. What is important is for all of the area to be treated to be treated. The substrate may thus be made to move, especially so as to run translationally past a stationary laser line, generally below but optionally above the laser line. This embodiment is particularly advantageous for a continuous treatment. Alternatively, the substrate may be stationary and the laser may be moved. Preferably, the difference between the respective speeds of the substrate and the laser is greater than or equal to 1 meter per minute, or 4 meters per minute or even 6, 8, 10 or 15 meters per minute, so as to ensure a high treatment rate. When it is the substrate that is made to move, especially translationally, it may be moved using any mechanical conveying means, for example translational conveyor belts, rollers or trays. The conveying system is used to control and regulate the run speed. The laser may also be moved so as to adjust its distance from the substrate, which may in particular be useful when the substrate is curved, but not only in such a case. Indeed, it is preferable for the laser beam to be focused on the coating to be treated so that the latter is located at a distance of less than or equal to 1 mm from the focal plane. If the system for moving the substrate or moving the laser is not sufficiently precise as regards the distance between the substrate and the focal plane, it should preferably be possible to adjust the distance between the laser and the substrate. This adjustment may be automatic and in particular regulated using a distance measurement taken upstream of the treatment.

The laser radiation device may be integrated into a film deposition line, for example a magnetron cathode sputtering deposition line, or a chemical vapor deposition (CVD) line, especially a vacuum or atmospheric pressure plasma-enhanced chemical vapor deposition (PECVD or AP-PECVD) line.

Figure 2:
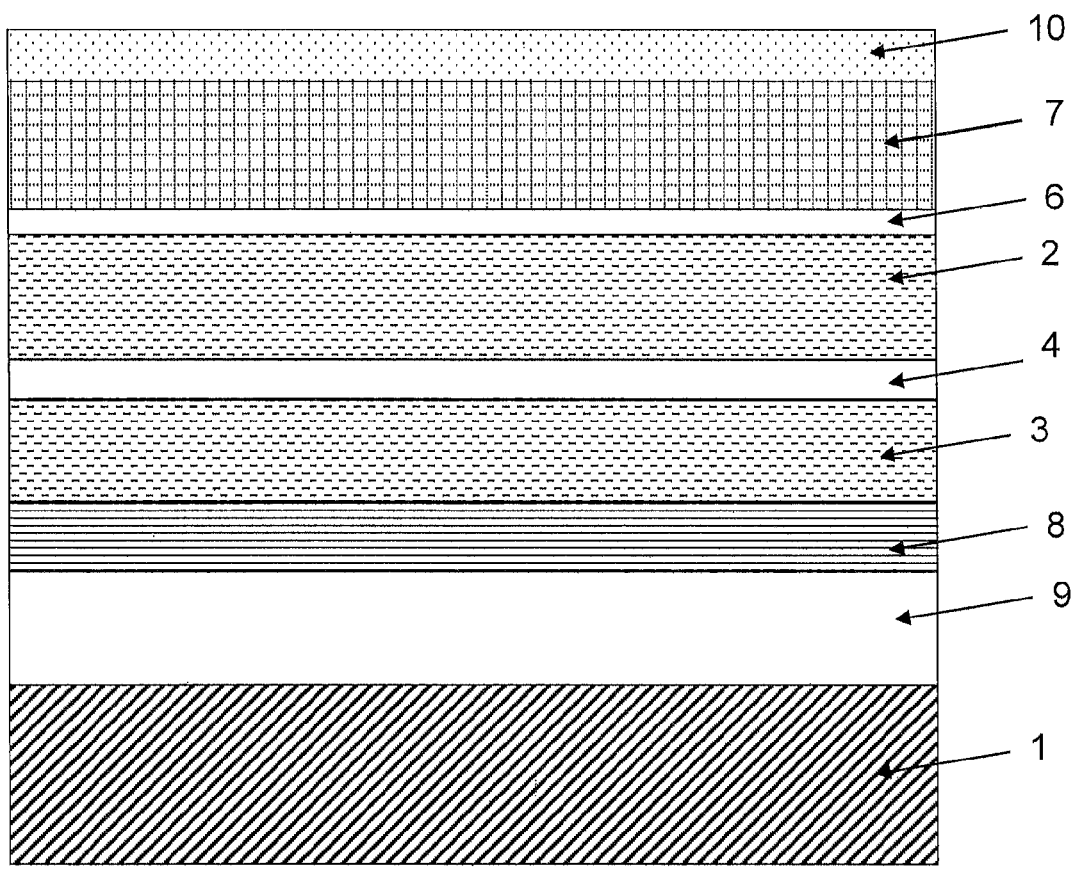

FIGS. 1 and 2 schematically illustrate partial cross sections through two preferred embodiments of the invention. Only the multilayer placed on the substrate and some of the (especially glass) substrate are shown.

The films 2 and 3 of a transparent electrically conductive oxide (typically ITO), the intermediate film 4 (for example made of silica or silicon nitride or even of zinc tin oxide) and the oxygen barrier film 6 (typically made of silicon nitride) are shown deposited on the substrate 1.

The other (optional) films shown in FIG. 1 are an adhesion film 5 (for example made of silica) and a low-refractive-index film 7 (for example made of silica).

In FIG. 2, the (optional) films shown are:
on the oxygen barrier film 6 (typically made of silicon nitride), a low-refractive-index film 7 (for example made of silica) and a protective film 10 (typically made of $TiO_2$, which may be photocatalytic); and
under the TCO film 3 a low-refractive-index film 8 (typically made of silica) and a high-refractive-index film 9 (typically made of silicon nitride).

The following examples illustrate the invention without however limiting its scope.

Multilayers such as described in table 1 below, of the type illustrated in FIG. 1, were deposited in a known way on glass substrates by magnetron cathode sputtering.

The table indicates the physical thicknesses (in nm) of each of the films of the multilayer. The first row of the table corresponds to the last film of the multilayer (i.e. that making contact with the atmosphere). The second column of the table indicates the reference of the corresponding film used in FIG. 1. The silicon oxide and nitride films were doped with aluminum in order to facilitate their deposition by magnetron cathode sputtering.

TABLE 1

|  |  | C1 | C2 | 1 | 2 | 3 | 4 |
|---|---|---|---|---|---|---|---|
| $SiO_x$ | 7 | 70 | 70 | 70 | 70 | 70 | 70 |
| $SiN_x$ | 6 | 20 | 20 | 20 | 20 | 20 | 20 |
| ITO | 2 | — | — | 60 | 50 | 60 | 40 |
| $SiO_x$ | 4 | — | — | — | 10 | 10 | — |
| $SiN_x$ | 4 | — | — | 10 | — | — | 10 |
| ITO | 3 | 120 | 100 | 60 | 50 | 60 | 40 |
| $SiO_x$ | 5 | 35 | 35 | 35 | 35 | 35 | 35 |

Examples C1 and C2 are comparative examples comprising only a single TCO film deposited on an adhesion film and coated with an oxygen barrier film and a low-index film.

In contrast, examples 1 to 4 according to the invention comprise two TCO films (here of ITO) separated by a dielectric intermediate film made of silicon nitride or oxide depending on the example.

These multilayers were deposited on two types of float glass substrate: a substrate of clear glass (containing 0.1% iron oxide), the light transmission factor of which was higher than 85%, and a substrate of dark gray glass, the light transmission factor of which was lower than 30%.

The coated substrates were then subjected to a bending/tempering step. The bending was a gravitational bending operation carried out using a rectangular bending frame to obtain a cylindrical shape having a radius of curvature of 20 cm.

The bending is referred to as "convex" when the multilayer is located on the convex side after bending, or "concave" when the multilayer is located on the concave side after bending. In the case of a convex bend, the multilayer is subjected to tensile stresses that may generate cracks and/or haze. In the case of a concave bend, the multilayer is subjected to compressive stresses that may generate haze.

Tables 2 and 3 below collate the results obtained.

For each trial, the tables indicate:
the nature of the glass ("T" for the glass tinted dark gray and "C" for the clear glass);
the type of multilayer, designated by the references used in table 1;
the sheet resistance measured before and after the bending/tempering;
the type of bending: convex (CV) or concave (CC);
a score from 0 to 10 providing a qualitative measure, assessed by visual examination, of the quantity of cracks after bending, a score of 0 indicating an absence of cracks; and
a score from 0 to 10 providing a qualitative measure, assessed by visual examination, of the haze after bending, a score of 0 indicating an absence of haze.

TABLE 2

| Glass | T | T | T | C | T | T |
|---|---|---|---|---|---|---|
| Multilayer | C1 | C2 |  | 1 |  | 2 |
| $R_c$ before (Ω) | 53 | 63 |  | 55 |  | 67 |
| $R_c$ after (Ω) | 19 | 24 |  | 20 |  | 24 |
| Bending type | CV | CC | CV | CC | CV | CC |
| Cracks | 5 | — | 0 | — | 0 | — |
| Haze | 0 | 8 | 8 | 2 | 0 | 0 |

TABLE 3

| Glass | C | T | T | C | C |
|---|---|---|---|---|---|
| Multilayer | 2 |  | 3 |  | 4 |
| $R_c$ before (Ω) | 68 |  | 54 |  | 83 |
| $R_c$ after (Ω) |  |  | 19 |  | 31 |
| Bending type | CV | CC | CV | CV | CC |
| Cracks | 0 | — | 0 | 0 | — |
| Haze | 0 | 0 | 0 | 0 | 0 |

These results show that replacing a single TCO film with two films of the same TCO, of cumulative thickness equal to the thickness of the single film, allows the same level of sheet resistance, and therefore the same low-E performance, to be obtained: about 19Ω for a total thickness of 120 nm and 24Ω for a total thickness of 100 nm.

At the same time, resistance to bending and to tempering is clearly improved by virtue of the invention. Multilayers according to the invention are therefore able to resist more intense bending treatments (lower radii of curvature) than multilayers not according to the invention.

The invention claimed is:

1. A material comprising a substrate with a thin-film multilayer coated on at least one surface of said substrate, said thin-film multilayer comprising at least two films based on a transparent electrically conductive oxide, said at least two films being separated by at least one dielectric intermediate film having a physical thickness of at most 50 nm, and said thin-film multilayer having no metal films being deposited between said at least two films based on a transparent electrically conductive oxide, wherein said thin-film multilayer further comprises at least one oxygen barrier film located above the film located furthest from the substrate of the at least two films based on a transparent electrically conductive oxide, and wherein each film of the at least two films based on a transparent electrically conductive oxide has a physical thickness in a range of from 20 to 80 nm.

2. The material as claimed in claim 1, wherein the substrate is made of glass.

3. The material as claimed in claim 1, wherein each transparent electrically conductive oxide is chosen from mixed indium tin oxide, mixed indium zinc oxide, gallium- or aluminum-doped zinc oxide, niobium-doped titanium oxide, zinc or cadmium stannate and antimony- and/or fluorine-doped tin oxide.

4. The material as claimed in claim 1, wherein each film of the at least two films based on a transparent electrically conductive oxide has a physical thickness in a range of from 30 to 80 nm.

5. The material as claimed in claim 1, wherein a cumulative physical thickness of all the films based on a transparent electrically conductive oxide is in a range of from 40 to 400 nm.

6. The material as claimed in claim 1, wherein the thin-film multilayer comprising two films based on a transparent electrically conductive oxide are separated by at most two dielectric intermediate films.

7. The material as claimed in claim 1, wherein the or each at least one dielectric intermediate film is based on a compound chosen from oxides, nitrides or oxynitrides of silicon, aluminum, titanium, tin, zinc, zirconium, niobium, nickel, chromium or one of their mixtures.

8. The material as claimed in claim 1, wherein the physical thickness of the at least one, or each, dielectric intermediate film is in a range of from 2 to 20 nm.

9. The material as claimed in claim 1, wherein the barrier film is based on a compound chosen from silicon nitride, niobium oxide, tungsten oxide, bismuth oxide, titanium oxide, zirconium nitride and aluminum nitride.

10. The material as claimed in claim 1, wherein the thin-film multilayer comprises, under the film of the at least two films based on a transparent electrically conductive oxide closest to the substrate, at least one adhesion film.

11. A process for obtaining a material as claimed in claim 1, comprising depositing the films of the thin-film multilayer, and heat treating the deposited films with a heat treatment chosen from tempering, bending, annealing and rapid annealing treatments.

12. The process as claimed in claim 11, wherein the rapid annealing is carried out using a flame, a plasma torch or laser radiation.

13. A glazing unit, comprising at least one material according to claim 1.

14. The glazing unit as claimed in claim 13, which is a curved glazing unit.

15. The material as claimed in claim 5, wherein the cumulative physical thickness is in a range of from 60 to 300 nm.

16. The material as claimed in claim 6, wherein the two films are separated by a single dielectric intermediate film.

17. The material as claimed in claim 8, wherein the physical thickness of the at least one, or each, dielectric intermediate film is comprised in a range extending from 5 to 15 nm.

18. The material as claimed in claim 10, wherein the at least one adhesion film is made of silica.

19. The process as claimed in claim 11, wherein the films are deposited by cathode sputtering.

20. The glazing unit as claimed in claim 13, wherein the glazing unit is a glazing unit of a ground, rail, water or aerial vehicle, or of a building, or a fire-resistant glazing unit, or an oven or refrigerator door.

21. The glazing unit as claimed in claim 20 wherein the glazing unit is an automobile windshield, a rear windshield or a side window or an automobile roof.

\* \* \* \* \*